(12) United States Patent
Okumura et al.

(10) Patent No.: US 12,740,233 B2
(45) Date of Patent: Sep. 15, 2026

(54) DISPLAY DEVICE AND MANUFACTURING METHOD OF DISPLAY DEVICE WITHOUT DAMAGING SEMICONDUCTOR LAYER

(71) Applicant: Samsung Display Co., Ltd., Yongin-Si (KR)

(72) Inventors: Hiroshi Okumura, Yongin-si (KR); Jong Oh Seo, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 339 days.

(21) Appl. No.: 18/232,226

(22) Filed: Aug. 9, 2023

(65) Prior Publication Data

US 2024/0057377 A1 Feb. 15, 2024

(30) Foreign Application Priority Data

Aug. 12, 2022 (KR) ........................ 10-2022-0101383

(51) Int. Cl.
*H10K 59/12* (2023.01)
*H10K 59/121* (2023.01)
*H10K 71/40* (2023.01)

(52) U.S. Cl.
CPC ..... *H10K 59/1201* (2023.02); *H10K 59/1213* (2023.02); *H10K 71/40* (2023.02)

(58) Field of Classification Search
CPC ........... H10K 59/1201; H10K 59/1213; H10K 71/40; H10K 59/123; H10K 59/12; H10K 71/00; H10D 86/0221; H10D 86/60; H10D 86/0223; H01L 21/225; H01L 21/228; H01L 21/324; H10H 29/142; H10P 32/14; H10P 32/16; H10P 95/90
See application file for complete search history.

(56) References Cited

U.S. PATENT DOCUMENTS 3,998,675 A * 12/1976 Langheinrich ........ H01L 23/291 438/945
7,151,017 B2 12/2006 Ohnuma
8,574,976 B2 11/2013 Yamazaki et al.
9,263,590 B2 2/2016 Lee et al.
9,359,513 B1 * 6/2016 Takashima ........... C09D 11/107
9,997,357 B2 * 6/2018 Arghavani ............ H01L 21/223
9,997,709 B2 6/2018 Noh
2002/0046705 A1 * 4/2002 Sandhu ............. H01L 21/67207 257/E21.148
2005/0181566 A1 8/2005 Machida et al.
2008/0290462 A1 * 11/2008 Schmenn ............. H10D 89/611 257/E21.334

(Continued)

FOREIGN PATENT DOCUMENTS

KR 10-2005-0081174 A 8/2005
KR 10-2016-0055563 A 5/2016

(Continued)

*Primary Examiner* — Caleb E Henry
(74) *Attorney, Agent, or Firm* — Innovation Counsel LLP

(57) ABSTRACT

Provides is a manufacturing method of a display device including steps of forming a semiconductor on a substrate; applying a doping solution to the semiconductor layer; and doping by heat treating the semiconductor layer to which the doping solution is applied, wherein the doping solution includes a solvent and a dopant, and the dopant contains at least one of triethyl borate, tris(trimethylsilyl)borate, and trimethylboroxine.

15 Claims, 15 Drawing Sheets

(56) References Cited

U.S. PATENT DOCUMENTS

2009/0047760 A1* 2/2009 Yamazaki .............. H10D 62/40
257/E21.414
2013/0307075 A1* 11/2013 Hekmatshoar-Tabari ..................
H10D 30/6757
438/164
2013/0328110 A1* 12/2013 Hekmatshoar-Tabari ..................
H10D 30/875
257/256
2014/0191320 A1* 7/2014 Hekmatshoartabari ......................
H10D 30/6745
438/23
2014/0360571 A1* 12/2014 Ji .......................... H10F 71/121
136/258
2016/0133725 A1 5/2016 Chung et al.
2016/0240381 A1* 8/2016 Long ................... H01L 21/2254
2017/0162172 A1* 6/2017 Saotome ............ H10D 30/6739
2017/0288155 A1* 10/2017 Kurihara ............. C07F 15/0033
2018/0025912 A1* 1/2018 Ikegami ................ H01L 21/225
438/57
2019/0273165 A1* 9/2019 Hekmatshoartabari ......................
H01L 21/02576
2021/0320268 A1 10/2021 Kang et al.
2021/0328046 A1* 10/2021 Saotome ............ H10D 30/6755

FOREIGN PATENT DOCUMENTS

KR 10-1616190 B1 5/2016
KR 10-2180554 B1 11/2020
KR 10-2021-0126203 A 10/2021

* cited by examiner

FIG. 2

ACT
SUB

FIG. 3

ACT
SUB

DISPLAY DEVICE AND MANUFACTURING METHOD OF DISPLAY DEVICE WITHOUT DAMAGING SEMICONDUCTOR LAYER

CROSS-REFERENCE TO RELATED APPLICATION

This application claims priority to and the benefit of Korean Patent Application No. 10-2022-0101383 filed in the Korean Intellectual Property Office on Aug. 12, 2022, the entire contents of which are incorporated herein by reference.

BACKGROUND

(a) Technical Field

The present disclosure relates to a display device and a manufacturing method thereof, and more particularly, relates to a display device and a manufacturing method of doping a semiconductor layer without damaging the semiconductor layer.

(b) Description of the Related Art

A display device is a device that displays an image. Recently, an emissive display device (organic light emitting diode display), which is a kind of emissive display device, has been attracting attention.

Since emissive display device has self-luminous characteristics and unlike a liquid crystal display device, it does not require a separate light source, and thus the thickness and weight can be reduced. In addition, the emissive display device exhibits high quality characteristics such as low power consumption, high luminance, and high reaction speed.

In general, an emissive display device includes a substrate, a plurality of thin film transistors positioned on the substrate, a plurality of insulation layers disposed between wires that form thin film transistors, and an organic light emitting element connected to the thin film transistor.

The emissive display device includes a plurality of pixels, and each pixel includes a plurality of transistors. The transistor contains a polycrystalline semiconductor. In order to form a polycrystalline semiconductor, an amorphous semiconductor undergoes crystallization through heat treatment such as a laser.

The above information disclosed in this Background section is only for enhancement of understanding of the background of the disclosure, and therefore it may contain information that does not form the prior art that is already known in this country to a person of ordinary skill in the art.

SUMMARY

Embodiments are to provide a manufacturing method of a display device for doping a semiconductor layer without damages, and a display device manufacturing using the manufacturing method.

A manufacturing method of a display device according to an embodiment includes: forming a semiconductor on a substrate; applying a doping solution to the semiconductor layer; and doping by heat treating the semiconductor layer to which the doping solution is applied, wherein the doping solution includes a solvent and a dopant, and the dopant contains at least one of triethyl borate, tris(trimethylsilyl) borate, and trimethylboroxine.

The solvent may be one or more selected from poly-isobutyl methacrylate (IBMA), α-terpineol, diethylene glycol monobutyl ether, polydimethylsiloxane, poly(cyclopentasilane), polysilazane SOG, cyclohexane, and cyclooctane.

A content of dopant in the doping solution may be 0.05 wt % to 50 wt %. The doping by heat treating the semiconductor layer to which the doping solution is applied may include is accomplished by a heat treatment and a secondary heat treatment.

The primary heat treatment may be performed at a temperature of 80° C. to 150° C. for 2 to 5 minutes, and the secondary heat treatment may be performed at a temperature of 400° C. to 420° C. for 30 minutes to 1 hour.

The forming the semiconductor layer in the substrate may include: forming amorphous silicon on the substrate, and forming polycrystalline silicon by crystallizing the amorphous silicon.

In the doping by heat treating the semiconductor layer to which the doping solution is applied, the doping may be carried out on a top side of the semiconductor layer and not carried out on a bottom side of the semiconductor layer.

After the doping by heat treating of the semiconductor layer to which the doping solution is applied, a lower surface of the semiconductor layer in contact with the substrate may include an undoped region, and a doping concentration may include from the undoped region to an upper surface of the semiconductor layer.

After the doping by heat treating the semiconductor layer to which the doping solution is applied, a doping concentration of the semiconductor layer may gradually decrease from an upper surface of the semiconductor layer to a lower surface of the semiconductor layer.

After the doping by heat treating the semiconductor layer to which the doping solution is applied, no peak of the doping concentration may appear within the semiconductor layer.

The applying the doping solution to the semiconductor layer may be performed using an inkjet coater, a spin coater, or a die coater.

A manufacturing method of a display device according to an embodiment includes: forming a semiconductor on a substrate; applying a doping solution to the semiconductor layer; and doping by heat treating the semiconductor layer to which the doping solution is applied, wherein the doping solution includes a solvent and a dopant, and the dopant contains at least one of $H_3PO_4$, $H^3PO_3$, and tris-trimethylsilyl phosphate.

The solvent may be one or more selected from poly (isobutyl methacrylate) (IBMA), α-terpineol, diethylene glycol monobutyl ether, polydimethylsiloxane, poly(cyclopentasilane), polysilazane (SOG), cyclohexane, and cyclooctane Poly-isobutyl methacrylate (IBMA), α-terpineol, Diethylene glycol monobutyl ether, Polydimethylsiloxane, Poly-cyclopentasilane, polysilazan (SOG), Cyclohexane, Cyclooctane.

A content of dopant in the doping solution may be 0.05 wt % to 50 wt %.

The doping by heat treating the semiconductor layer to which the doping solution is applied is accomplished by a primary heat treatment and a secondary heat treatment.

The primary heat treatment is performed at a temperature of 80° C. to 150° C. for 2 to 5 minutes, and the secondary heat treatment may be performed at a temperature of 400° C. to 420° C. for 30 minutes to 1 hour.

A display device according to an embodiment includes: a substrate; a transistor including a semiconductor layer positioned on the substrate; and a light emitting diode connected with the transistor, wherein the semiconductor layer includes polycrystalline silicon and a doping material, a lower surface of the semiconductor layer in contact with the substrate includes an undoped region, and a doping concentration increases from the undoped region to an upper surface of the semiconductor layer.

The doping material may be boron or phosphorus.

A doping concentration of the semiconductor layer may gradually decrease from an upper surface of the semiconductor layer to a lower surface of the semiconductor layer.

No peak of the doping concentration may appear within the semiconductor layer.

According to the embodiments, a manufacturing method of a display device for doping a semiconductor layer without damages, and a display device manufacturing using the manufacturing method can be provided.

BRIEF DESCRIPTION OF THE DRAWINGS

FIGS. 2, 3, 4, 5, and 6 show the semiconductor layer formation process according to the embodiment of FIG. 1, step-by-step.

DETAILED DESCRIPTION OF THE DISCLOSURE

Figure 1:
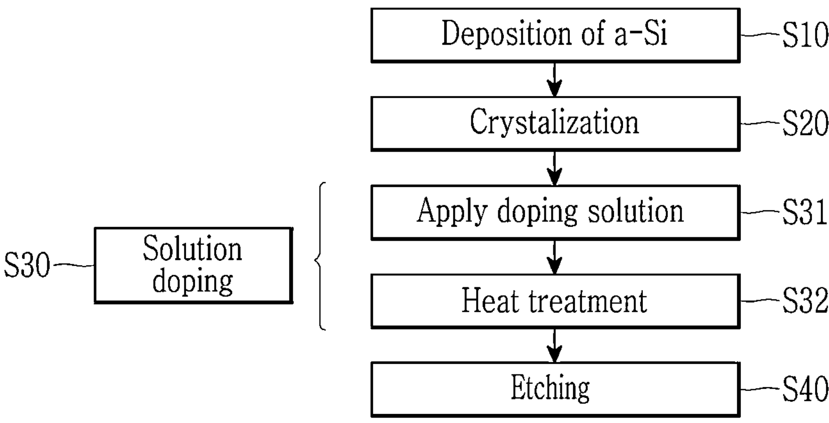
FIG. 1 schematically illustrates a semiconductor layer forming process according to the present embodiment.

Hereinafter, various embodiments of the present disclosure will be described in detail with reference to the accompanying drawing, and thus a person of an ordinary skill can easily perform it in the technical field to which the present disclosure belongs. The present disclosure may be implemented in several different forms and is not limited to the embodiments described herein.

In order to clearly explain the present disclosure, parts irrelevant to the description are omitted, and the same reference sign is designated to the same or similar constituent elements throughout the specification.

In addition, since the size and thickness of each component shown in the drawing are arbitrarily indicated for better understanding and ease of description, the present disclosure is not necessarily limited to the drawings. In the drawings, the thickness of layers, films, panels, regions, etc., are exaggerated for clarity. In addition, in the drawing, the thickness of some layers and regions is exaggerated for better understanding and ease of description.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, throughout the specification, the word "on" a target element will be understood to mean positioned above or below the target element, and will not necessarily be understood to mean positioned "at an upper side" based on an opposite to gravity direction.

In addition, unless explicitly described to the contrary, the word "comprise", and variations such as "comprises" or "comprising", will be understood to imply the inclusion of stated elements but not the exclusion of any other elements.

Further, throughout the specification, the phrase "on a plane" means viewing a target portion from the top, and the phrase "on a cross-section" means viewing a cross-section formed by vertically cutting a target portion from the side.

Hereinafter, a manufacturing method of a display device according to the present embodiment will be described in detail with reference to the drawing. A manufacturing method of a display device according to the present embodiment has a main feature in a channel doping method of a semiconductor layer. Hereinafter, the channel doping method will be mainly described.

FIG. 1 schematically illustrates a semiconductor layer forming process according to the present embodiment. Referring to FIG. 1, a semiconductor layer forming method according to the present embodiment includes depositing amorphous silicon (a-Si) (S10), crystallizing a semiconductor layer (S20), applying a doping solution (S31), performing a heat treatment (S32), and etching the semiconductor layer (S40).

Figure 2:
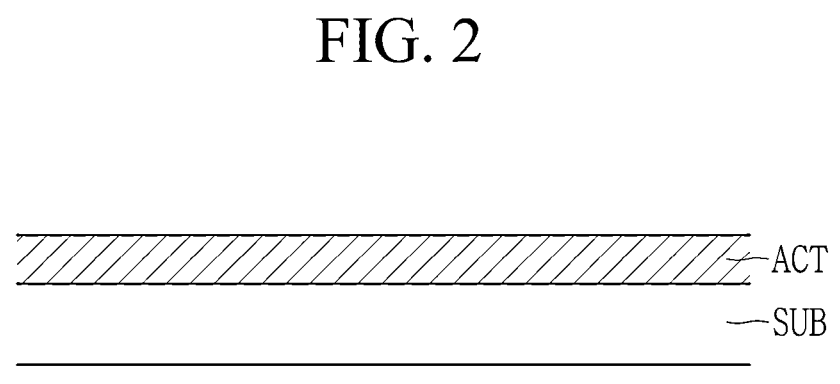

FIGS. 2, 3, 4, 5, and 6 show the semiconductor layer formation process according to the embodiment of FIG. 1 in detail. Referring to FIG. 2, a substrate SUB is provided, and a semiconductor layer ACT is deposited on the substrate SUB (S10). In this case, the deposited semiconductor layer ACT may be amorphous silicon (a-Si).

Figure 3:
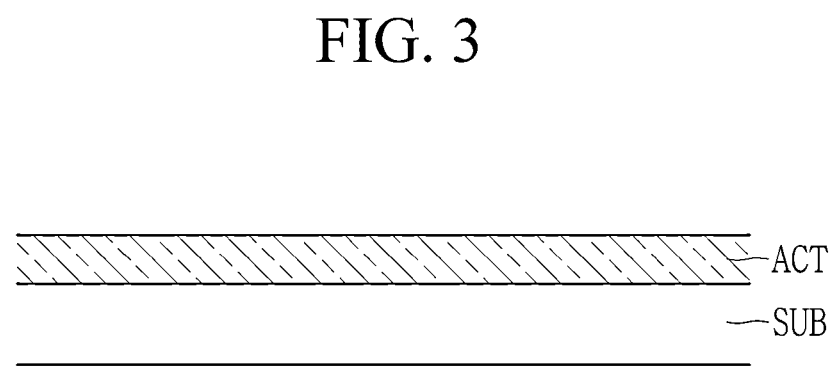

Next, the semiconductor layer is crystallized (S20). Referring to FIG. 3, amorphous silicon may become polycrystalline silicon by crystallization of the semiconductor layer. In this case, the crystallization process of the semiconductor layer may be performed by an excimer laser annealing (ELA) process. When a laser is irradiated on amorphous silicon, amorphous silicon melts and recrystallizes to become polycrystalline silicon.

Figure 4:
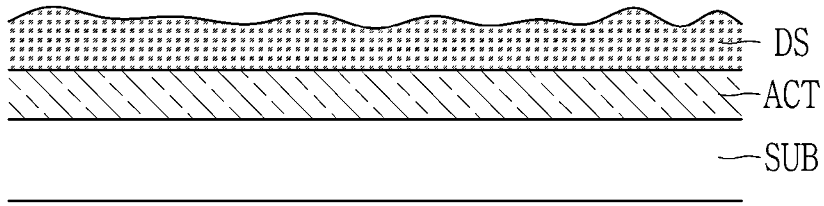

Next, a doping solution is applied (S31). In FIG. 4, the semiconductor layer ACT to which a doping solution DS is applied is shown. Such a doping process is performed to adjust a threshold voltage of a transistor. In general, a threshold voltage of a transistor including low temperature polysilicon (LTPS) may be positioned on the (−) side. Therefore, boron (B) may be doped to move to 0 V, that is, the (+) side. Alternatively, phosphorus (P) may be doped to move the threshold voltage in the (−) direction.

Although described later, such doping may be performed by an ion injection method. Since the ion injection method is a method of rapidly accelerating and injecting dopant ions, there is a problem in that damage occurs to the semiconductor layer during the doping process as the applied voltage increases.

Accordingly, the display device according to the present embodiment is doped using a doping solution. When doping is carried out with such a method, damage to the semiconductor layer caused by doping can be minimized. The doping solution may be applied using an inkjet coater, a spin coater, or a die coater.

The doping solution may include a solvent and a dopant. The solvent may be at least one selected from poly(isobutyl methacrylate) (IBMA), α-terpineol, diethylene glycol monobutyl ether, polydimethylsiloxane, polycyclopentasilane, polysilazane SOG, cyclohexane, and cyclooctane.

A dopant may be a compound containing a doping element in its structural formula. For example, when the doping material is B, the dopant may be one or more of triethyl borate, tris(trimethylsilyl)borate, and trimethylboroxine.

In addition, when the doping material is P, the dopant may be one or more of phosphoric acid ($H_3PO_4$), phosphorous acid ($H_3PO_3$), and tris(trimethylsilyl)phosphate.

The dopant content in the doping solution may be 0.05 wt % to 50 wt %. More specifically, it may be 0.1 wt % to 20 wt %. This content is a range for effective solution doping. That is, when the dopant content is less than 0.05 wt %, doping may not be performed well, and when the dopant content is more than 50 wt %, doping may be excessive.

Figure 5:
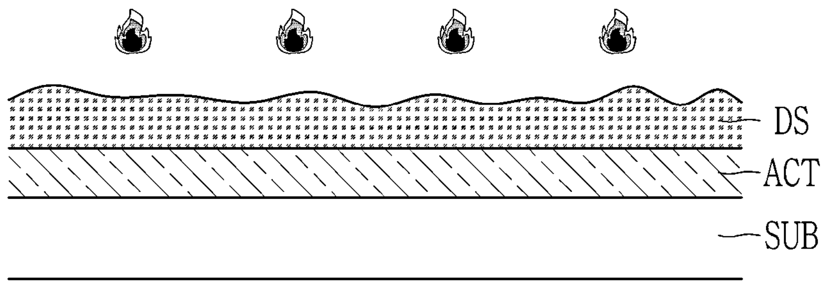

Next, heat treatment is performed on the semiconductor layer to which the doping solution is applied (S32). FIG. 5 shows such a heat treatment process. In this case, the heat treatment may include primary heat treatment for baking the doping solution and secondary heat treatment for activation. The primary heat treatment may be carried out at a temperature of 80° C. to 150° C. for 2 to 5 minutes. This temperature is a range for effective solution doping. When the heat treatment temperature is less than 80° C., doping may not be carried out well. The secondary heat treatment may be performed at a temperature of 400° C. to 420° C. for 30 minutes to 1 hour. This temperature range is a range for effective solution doping.

Through such doping solution application (S31) and heat treatment (S32), the semiconductor layer ACT is doped (S30). When the semiconductor layer ACT is doped with such solution doping, a top surface of the semiconductor layer ACT is mainly doped and a bottom surface is hardly doped. Therefore, a back channel leak can be reduced and a leakage current Ioff can be reduced. Regarding the specific effect, it will be described later.

In addition, although it will be described separately later, when solution doping is performed as in the present embodiment, the concentration of the doping material in the semiconductor layer ACT decreases gently without a peak. In the case of ion implantation doping, the doping concentration on the back side of the semiconductor layer ACT is higher than on the top side, or a peak of doping concentration is formed within the semiconductor layer ACT. However, in the solution doping according to the present embodiment, the concentration of the doping material in the semiconductor layer ACT gradually decreases without a peak. These effects will be separately described in detail later.

Figure 6:
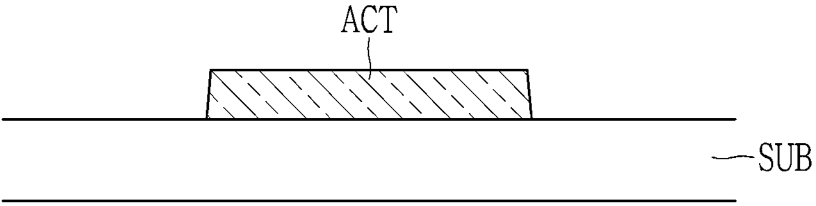

Next, referring to FIG. 6, the semiconductor layer ACT is patterned by etching (S40).

When solution doping is performed as described above, damage to the semiconductor layer can be prevented and the afterimage characteristic can be improved compared to conventional voltage doping. Hereinafter, the effect of solution doping according to the present embodiment will be described.

Figure 7:
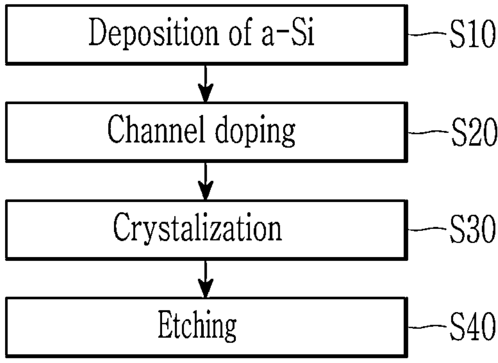
FIGS. 7 and 8 show a doping process according to another embodiment.
Figure 8:
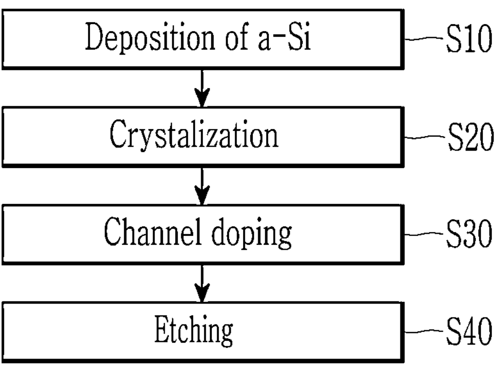

FIGS. 7 and 8 show a doping process according to another embodiment. In the case of FIG. 7, a crystallization process (S20) is performed after channel doping (S30), and in the case of FIG. 8, channel doping (S30) is performed after the crystallization process (S20). The channel doping in FIG. 7 and FIG. 8 is ion implantation doping using an accelerating voltage.

Such ion implantation doping may increase an instantaneous afterimage due to doping damage. Table 1 shows the afterimage characteristic measured according to the acceleration voltage. Referring to Table 1, it shows that the instantaneous afterimage of the display device is increased as the acceleration voltage is increased from 3 to 20 KeV.

TABLE 1

| Acceleration voltage (KeV) | ISFOM (dB) | Instantaneous afterimage(s) |
|---|---|---|
| 3 | −68.5 | 3.9 |
| 10 | −84.6 | 6.07 |
| 20 | | 7.91 |

Figure 9:
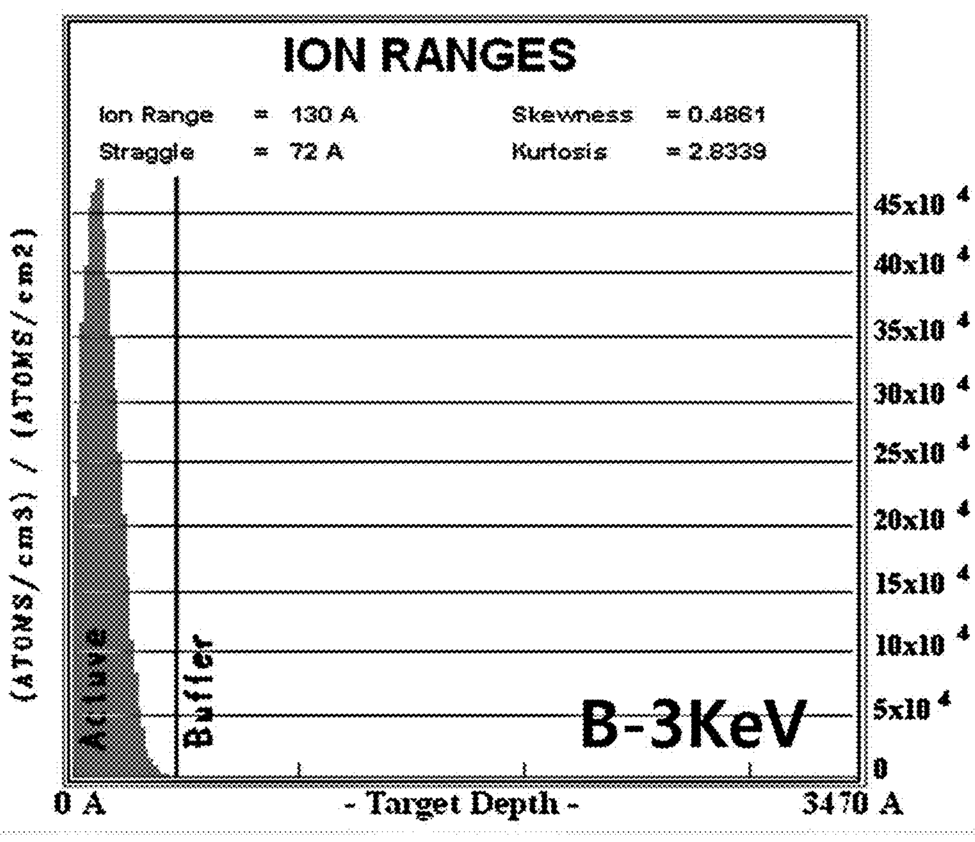
FIGS. 9 and 10 show a dopant implantation depth according to the accelerating voltage.
Figure 10:
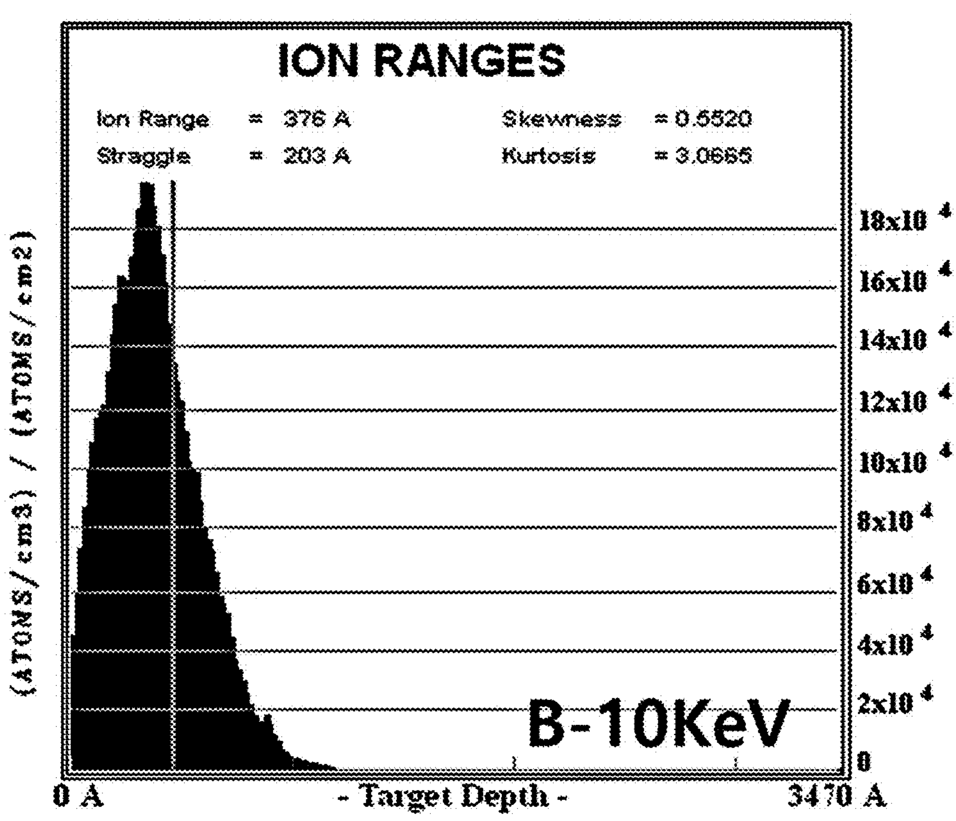
Figure 11:
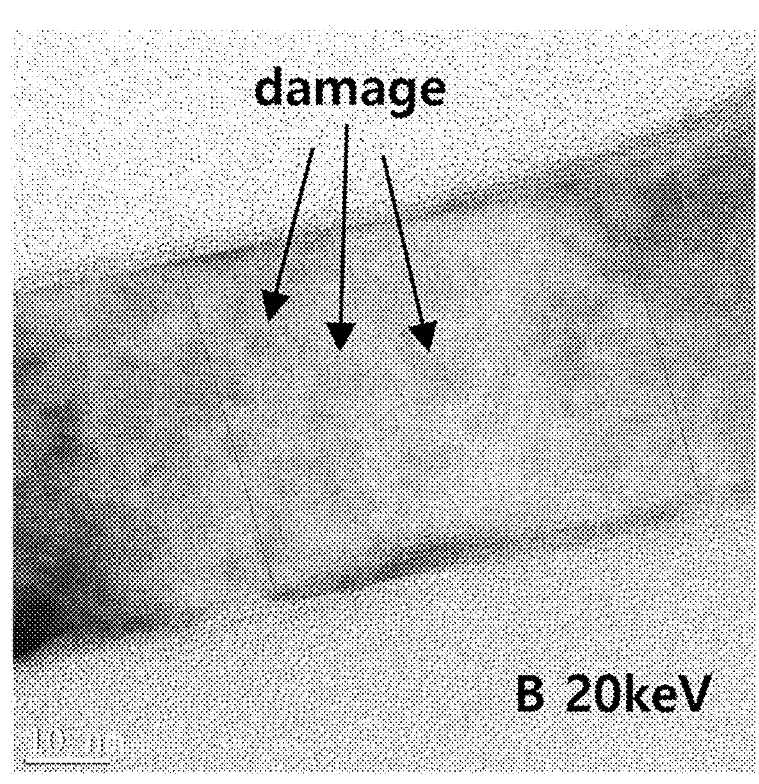
FIG. 11 shows a TEM image in which damage occurred in the semiconductor layer where doping using an accelerating voltage was performed.

FIGS. 9 and 10 show a dopant implantation depth according to the accelerating voltage. Referring to FIGS. 9 and 10, it confirms that the injection depth of the doping material is increased as the accelerating voltage is increased. FIG. 11 shows a TEM image in which damage occurred in the semiconductor layer where doping using an accelerating voltage was performed. FIG. 11 illustrates a portion where the damage is caused by doping using a voltage of 20 KeV.

As described above, when the accelerating voltage is increased in doping using an accelerating voltage, the defect caused by the doping acts as a charge trap site and increases the afterimage. In order to prevent the afterimage, low acceleration is desirable, but in this case, there is a problem that plasma discharge for doping is not sufficient.

However, in the case of the doping method according to the present embodiment, since doping is performed using a doping solution, damage can be prevented during the doping process. In addition, since it is doped by diffusion, doping is made only on the surface of the semiconductor layer and almost no doping is done on the back surface. As a result, back channel leakage can be reduced, and a leakage current Ioff is reduced. In addition, the generation of defects is prevented compared to voltage application doping.

Figure 12:
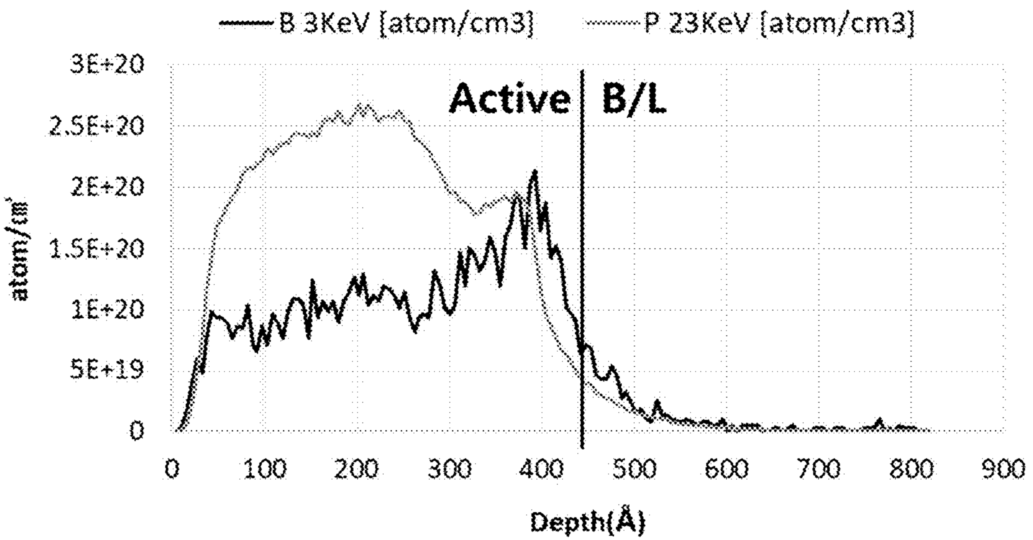
FIG. 12 shows a doping concentration for each depth while varying the acceleration voltage during doping according to the embodiment of FIG. 7.
Figure 13:
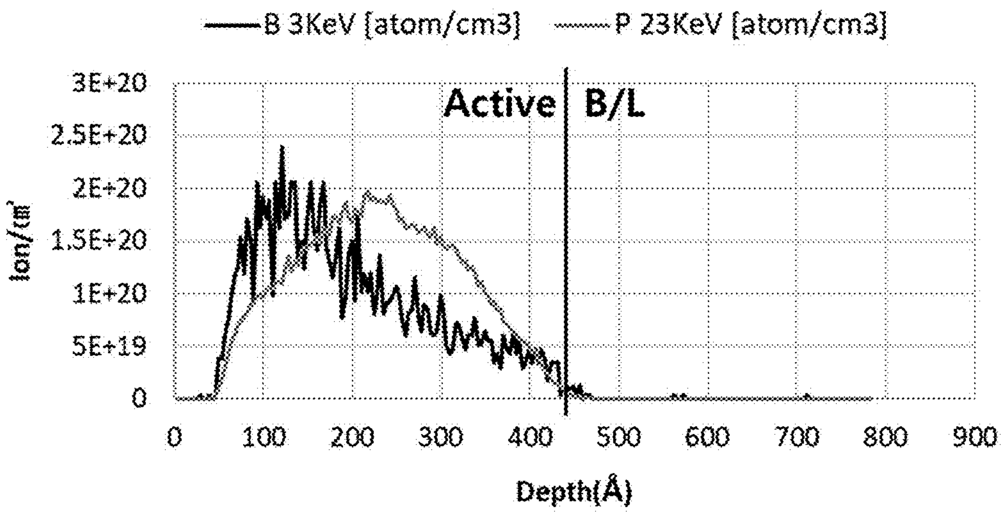
FIG. 13 shows a doping concentration for each depth while varying the acceleration voltage during doping according to the embodiment of FIG. 8.

FIG. 12 shows a doping concentration for each depth while varying the acceleration voltage during doping according to the embodiment of FIG. 7. FIG. 13 shows a doping concentration for each depth while varying the acceleration voltage during doping according to the embodiment of FIG. 8.

Referring to FIG. 12, it confirms that the doping concentration is high at the bottom of the semiconductor layer ACT (when accelerating to 3 KeV) or a region with a flat doping concentration appears within the semiconductor layer ACT in the case of voltage doping before ELA.

In addition, referring to FIG. 13, in the case of voltage doping after ELA, a peak of doping concentration is observed within the semiconductor layer ACT.

Figure 14:
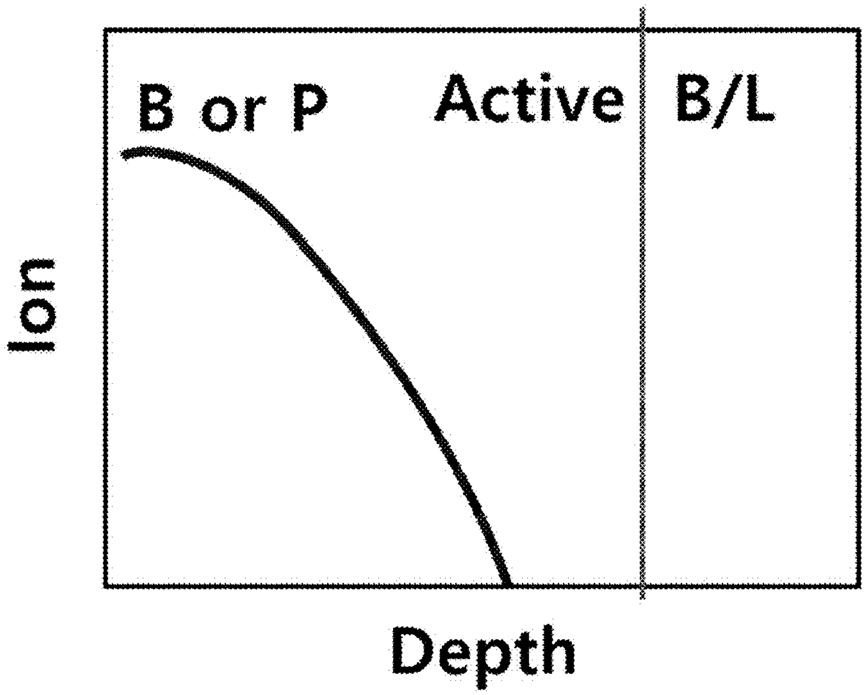
FIG. 14 briefly shows the doping concentration after solution doping according to the present embodiment.

FIG. 14 briefly shows the doping concentration after solution doping according to the present embodiment. Referring to FIG. 14, in the case of solution doping, the doping concentration appears high on the semiconductor layer ACT surface and tends to decrease gently toward the rear surface. The peak of the doping concentration inside is also not observed. This is because doping is achieved by thermal diffusion. Accordingly, when channel doping is performed according to the present embodiment, the doping concentration on the back surface of the semiconductor layer ACT, that is, the back channel, may be less than $10^{19}$ $cm^{-3}$.

As shown in FIG. 14, during doping according to the present embodiment, a lower surface of the semiconductor layer in contact with a substrate includes an undoped region, and the doping concentration may increase from the undoped region to an upper surface of the semiconductor layer.

Figure 15:
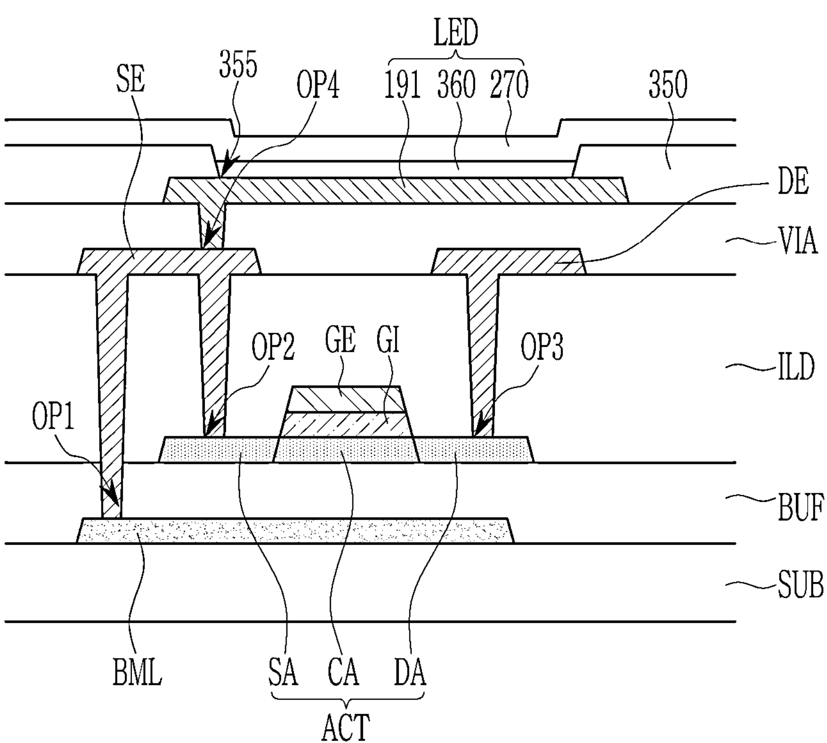
FIG. 15 is a schematic cross-sectional view of a display device according to an embodiment.

Hereinafter, the display device according to the present embodiment will be briefly described with reference to drawings. FIG. 15 is a schematic cross-sectional view of a display device according to an embodiment. FIG. 15 schematically illustrates a part of the cross-section for better comprehension and ease of description, but the present disclosure is not limited thereto.

Referring to FIG. 15, a substrate SUB is positioned or provided. The substrate SUB may include at least one of polystyrene, polyvinyl alcohol, poly(methyl methacrylate), polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. The substrate SUB may be a rigid substrate or a flexible substrate capable of bending, folding, rolling, and the like. The substrate SUB may be single-layered or multi-layered. The substrate SUB may be alternately laminated with at least one base layer and at least one inorganic layer containing sequentially laminated polymer resins.

A light blocking layer BML is positioned on the substrate SUB. The light blocking layer BML may include aluminum (Al), silver (Ag), magnesium (Mg), gold (Au), nickel (Ni), chromium (Cr), calcium (Ca), molybdenum (Mo), titanium (Ti), tungsten (W), and/or copper (Cu), and a metal oxide thereof, and may have a single layer or multi-layered structure including the same.

A buffer layer BUF is positioned on the light blocking layer BML. The buffer layer BUF may include a silicon oxide ($SiO_x$), a silicon nitride ($SiN_x$), a silicon oxynitride ($SiO_xN_y$), or amorphous silicon (Si).

A first opening OP1 may be formed in the buffer layer BUF and overlap the light blocking layer BML. In the first opening OP1, a source electrode SE may be connected to the light blocking layer BML.

The semiconductor layer ACT is positioned on the buffer layer BUF. The semiconductor layer ACT may include polycrystalline silicon. In this case, the semiconductor layer may be entirely doped with boron (B) or phosphorus (P). The doping concentration is the highest on the upper surface of the semiconductor layer ACT (i.e., the surface positioned farther from the substrate), and the doping concentration may decrease toward the lower surface of the semiconductor layer ACT (i.e., the surface positioned closer to the substrate). The doping concentration may decrease gently, and the lower surface of the semiconductor layer ACT may be hardly doped. The doping concentration of the lower surface of the semiconductor layer ACT may be less than $10^{19}$ $cm^{-3}$.

The semiconductor layer ACT may include a channel area CA overlapping a gate electrode GE, and a source area SA and a drain area DA positioned on both sides of the channel area CA.

A gate insulating layer GI is positioned on the semiconductor layer ACT. The gate insulating layer (GI) may include a silicon oxide ($SiO_x$), a silicon nitride ($SiN_x$), and a silicon oxynitride ($SiO_xN_y$), and may have a single layered or multi-layered structure including the same.

The gate insulating layer GI may be positioned to overlap the channel area CA of the semiconductor layer ACT. A gate conductive layer including the gate electrode GE may be positioned on the gate insulating layer GI. The gate conductive layer may include molybdenum (Mo), aluminum (Al), copper (Cu), titanium (Ti), and a metal oxide thereof, and may have a single layer or multi-layered structure including the same.

The gate electrode GE may be formed in the same process as the gate insulating layer GI and may have the same planar shape. The gate electrode GE may be positioned by overlapping the semiconductor layer ACT in a direction that is perpendicular to a plane of the substrate SUB.

An interlayer insulating layer ILD may be positioned on the semiconductor layer ACT and the gate electrode GE. The interlayer insulating layer ILD may include a silicon oxide ($SiO_x$), a silicon nitride ($SiN_x$), and a silicon oxide ($SiO_xN_y$), and may have a single layer or multi-layered structure including the same. When the interlayer insulating layer ILD has a multi-layered structure including a silicon nitride and a silicon oxide, the layer including a silicon nitride may be positioned closer to the substrate SUB than the layer including a silicon oxide.

The first opening OP1 overlapping the light blocking layer BML, a second opening OP2 overlapping the source area SA of the semiconductor layer ACT, and a third opening OP3 overlapping the drain area DA may be formed in the interlayer insulating layer ILD.

A data conductive layer including the source electrode SE and the drain electrode DE is positioned on the interlayer insulating layer ILD. The data conductive layer may include aluminum (Al), silver (Ag), magnesium (Mg), gold (Au), nickel (Ni), chromium (Cr), calcium (Ca), molybdenum (Mo), titanium (Ti), tungsten (W), and/or copper (Cu), and a metal oxide thereof, and may have a single layer or multi-layered structure including the same.

The source electrode SE may contact the light blocking layer BML through the first opening OP1 and may come into contact with the source area SA of the semiconductor layer ACT at the second opening OP2. The drain electrode DE may contact the drain area DA of the semiconductor layer ACT through the third opening OP3.

An insulating layer VIA is positioned on the data conductive layer. The insulating layer VIA includes organic insulating materials such as general-purpose polymers such as poly(methyl methacrylate) (PMMA) or polystyrene (PS), polymer derivatives with phenolic groups, acryl-based polymers, imide-based polymers, polyimides, and siloxane-based polymers.

The insulating layer VIA may include a fourth opening OP4 overlapping the source electrode SE. A first electrode 191 is positioned on the insulating layer VIA. A partition wall 350 is positioned on the insulating layer VIA and the first electrode 191. The barrier rib 350 has an opening 355 overlapping the first electrode 191. An emission layer 360 may be positioned within the opening 355. A second electrode 270 may be positioned on the partitioning wall 350 and the emission layer 360. The first electrode 191, the emission layer 360, and the second electrode 270 may form a light-emitting diode (LED).

Although an embodiment of the present disclosure has been described in detail above, the scope of the present disclosure is not limited thereto, and various modifications and improved forms made by a person of ordinary skill in the art using the basic concept of the present disclosure as defined in the following claims range also belong to the scope of the present disclosure.

What is claimed is:

1. A manufacturing method of a display device, comprising steps of:

forming a semiconductor on a substrate;

applying a doping solution to the semiconductor layer; and doping by heat treating the semiconductor layer to which the doping solution is applied, wherein the doping solution includes a solvent and a dopant, and wherein the dopant contains at least one of triethyl borate, tris (trimethylsilyl) borate, and trimethylboroxine, and wherein, after the doping by heat treating the semiconductor layer to which the doping solution is applied, a doping concentration of the semiconductor layer gradually decreases from an upper surface of the semiconductor layer to a lower surface of the semiconductor layer.

2. The manufacturing method of the display device of claim 1, wherein the solvent is one or more selected from poly-isobutyl methacrylate (IBMA), α-terpineol, diethylene glycol monobutyl ether, polydimethylsiloxane, poly (cyclopentasilane), polysilazane SOG, cyclohexane, and cyclooctane.

3. The manufacturing method of the display device of claim 1, wherein a content of dopant in the doping solution is 0.05 wt % to 50 wt %.

4. The manufacturing method of the display device of claim 1, wherein the doping by heat treating the semiconductor layer to which the doping solution is applied is accomplished by a primary heat treatment and a secondary heat treatment.

5. The manufacturing method of the display device of claim 4, wherein the primary heat treatment is performed at a temperature of 80° C. to 150° C. for 2 to 5 minutes, and the secondary heat treatment is performed at a temperature of 400° C. to 420° C. for 30 minutes to 1 hour.

6. The manufacturing method of the display device of claim 1, wherein the forming the semiconductor layer in the substrate is accomplished by forming amorphous silicon on the substrate, and forming polycrystalline silicon by crystallizing the amorphous silicon.

7. The manufacturing method of the display device of claim 1, wherein, in the doping by heat treating the semiconductor layer to which the doping solution is applied, the doping is carried out on a top side of the semiconductor layer and not carried out on a bottom side of the semiconductor layer.

8. The manufacturing method of the display device of claim 1, wherein, after the doping by heat treating of the semiconductor layer to which the doping solution is applied, a lower surface of the semiconductor layer in contact with the substrate includes an undoped region, and a doping concentration increases from the undoped region to an upper surface of the semiconductor layer.

9. The manufacturing method of the display device of claim 1, wherein, after the doping by heat treating the semiconductor layer to which the doping solution is applied, no peak of the doping concentration appears within the semiconductor layer.

10. The manufacturing method of the display device of claim 1, wherein the applying the doping solution to the semiconductor layer is performed using an inkjet coater, a spin coater, or a die coater.

11. A manufacturing method of a display device, comprising steps of:

forming a semiconductor on a substrate;

applying a doping solution to the semiconductor layer; and doping by heat treating the semiconductor layer to which the doping solution is applied, wherein the doping solution includes a solvent and a dopant, wherein the dopant contains at least one of $H_3PO_4$, $H_3PO_3$, and tris-trimethylsilyl phosphate, and wherein, after the doping by beat treating the semiconductor layer to which the doping solution is applied, a doping concentration of the semiconductor layer gradually decreases from an upper surface of the semiconductor layer to a lower surface of the semiconductor layer.

12. The manufacturing method of the display device of claim 11, wherein the solvent is one or more selected from poly (isobutyl methacrylate) (IBMA), α-terpineol, diethylene glycol monobutyl ether, polydimethylsiloxane, poly (cyclopentasilane), polysilazane (SOG), cyclohexane, and cyclooctane.

13. The manufacturing method of the display device of claim 11, wherein a content of dopant in the doping solution is 0.05 wt % to 50 wt %.

14. The manufacturing method of the display device of claim 11, wherein the doping by heat treating the semiconductor layer to which the doping solution is applied is accomplished by a primary heat treatment and a secondary heat treatment.

15. The manufacturing method of the display device of claim 14, wherein the primary heat treatment is performed at a temperature of 80° C. to 150° C. for 2 to 5 minutes, and the secondary heat treatment is performed at a temperature of 400° C. to 420° C. for 30 minutes to 1 hour.

* * * * *